United States Patent
Han et al.

[11] Patent Number: 5,908,791
[45] Date of Patent: Jun. 1, 1999

[54] METHOD OF FORMING A POLYCIDE GATE OF A SEMICONDUCTOR DEVICE

[75] Inventors: Seok-hyun Han, Anyang; Sang-jin Lee, Suwon; Kyoung-bo Shim, Yangju-gun; Dae-sik Cho, Yongin-gun, all of Rep. of Korea

[73] Assignee: Samsung Electronics Co., Ltd., Kyungki-Do, Rep. of Korea

[21] Appl. No.: 08/643,885

[22] Filed: May 7, 1996

[30] Foreign Application Priority Data

Oct. 11, 1995 [KR] Rep. of Korea ............ 95-34997

[51] Int. Cl.$^6$ .................................. H01L 21/00
[52] U.S. Cl. .................. 438/738; 438/710; 438/737; 438/719; 438/721; 438/714
[58] Field of Search ............... 156/643.1, 646.1, 156/657.1; 216/67, 70, 72; 437/193, 200; 438/710, 711, 737, 142, 197, 719, 721, 714, 738

[56] References Cited

U.S. PATENT DOCUMENTS

| | | | |
|---|---|---|---|
| 4,331,962 | 5/1982 | Neumann | 346/33 ME |
| 4,808,259 | 2/1989 | Jillie, Jr. et al. | 156/643 |
| 5,118,387 | 6/1992 | Kadomura | 156/657 |
| 5,310,456 | 5/1994 | Kadomura | 156/657 |
| 5,314,576 | 5/1994 | Kadomura | 156/655 |
| 5,338,701 | 8/1994 | Hsu et al. | 437/60 |
| 5,368,685 | 11/1994 | Kumihashi et al. | 156/643 |
| 5,474,648 | 12/1995 | Patrick et al. | 156/627.1 |
| 5,529,197 | 6/1996 | Grewal | 216/68 |
| 5,605,601 | 2/1997 | Kawasaki | 156/643.1 |

*Primary Examiner*—Nam Nguyen
*Assistant Examiner*—Steven H. Ver Steeg
*Attorney, Agent, or Firm*—Pillsbury Madison & Sutro LLP

[57] ABSTRACT

A method of forming a polycide gate of a semiconductor device, including the steps of etching all the metal silicide layer by using a plasma, and etching the polysilicon layer by relatively decreasing power for increasing the energy of a particles constituting the plasma, as compared with that in the step of etching the metal silicide layer. A physically and functionally stable polycide gate can be simply and rapidly formed.

9 Claims, 1 Drawing Sheet

METHOD OF FORMING A POLYCIDE GATE OF A SEMICONDUCTOR DEVICE

BACKGROUND OF THE INVENTION

The present invention relates to a method of forming a polycide gate of a semiconductor device, and more particularly, to an etching method for forming such a polycide gate.

Among semiconductor devices, in a metal oxide semiconductor (MOS) type of a semiconductor device, a gate is formed on a thin gate oxide film. At this time, the gate is formed of a conductor such as a polysilicon, a polycide or the like. The polycide is formed as a stacked structure in which a portion coming into contact with the gate oxide film consists of a polysilicon layer and a refractory metal silicide layer stacked on the polysilicon layer. As the refractory metal silicide, tungsten silicide (WSi) is mainly used.

As the scale of integration of semiconductor devices is increased and the critical dimension is decreased, the resistance of the polysilicon mainly used hitherto is increased, so that its function as a conductor causes a problem. At the same time, metal silicide is suitable to be used as a conductor such as for the gate of a semiconductor device, because damage caused due to the high temperature of its production process is small and its conductivity is high. However, since its adhesion to an insulating film is poor, the metal polycide structure is formed by using a method where the polysilicon is formed on the insulating film and the metal silicide is stacked thereon.

In a conventional method of forming the gate, as a material constituting the gate, a film is formed on the entire surface or a part of a semiconductor substrate including a portion where the gate will be formed. After forming an etching mask by using photolithography, a gate film which is in a part excluding the gate is removed by using an etching technique. At this time, as a method of forming the etching mask by using photolithography, there are two methods. One method is that a film is formed of a material constituting the gate, a photoresist is directly formed thereon, and a pattern is formed in the photoresist layer, thereby adapting the photoresist to function as an etching mask. The other method is that a film is formed of a material constituting the gate, an oxide film is formed thereon, a photoresist is formed thereon, a gate pattern is formed in the oxide film by etching the photoresist and oxide film, and the gate film is etched by using the above referenced pattern. The two methods are selectively used according to the necessity of the process, because they have respective merits and demerits.

In case of using the oxide film as the etching mask, the etching selectivity between the etching mask and film to be etched is improved. In case of performing the etching process by using the photoresist pattern, there is a merit that a problem of controlling the critical dimension is removed, due to a polymer which adheres to the sidewall of the pattern as by-product. Thus, it is suitable for the manufacturing of highly integrated semiconductor devices.

FIG. 1 shows a polycide gate structure formed through the conventional etching process, using a silicon oxide film as an etching mask 11, and a tungsten silicide 15 as the metal silicide. A gate oxide film 17, or a field oxide film 20, is formed on a semiconductor substrate 10. A polycide gate composed of a polysilicon layer 13 and a tungsten silicide layer 15, and an etching mask 11 consisting of a silicon oxide film, constitute the stacked structure.

Since no protection for the etching is provided in the sidewall part of the polycide gate, in case of using the conventional etching technique such as plasma etching or reactive ion etching (RIE), the undercutting occurs in the polysilicon layer 13, due to the characteristics of isotropic etching. The sidewall of the stacked structure constituting the polycide becomes rough due to particles such as ions or radicals which collide with the sidewall of the polycide gate. There is seriously generated a phenomenon such as a consuming or notching, in which the films of the metal silicide and polysilicon are removed during etching. Thus, it is difficult to control the uniformity of the semiconductor device, so that the function of the device is deteriorated. Reference numeral 19 in FIG. 1 shows the consumption of tungsten silicide 15.

FIG. 2 is an enlarged fragmentary cross-section of a detail of the structure shown in FIG. 1, showing the roughness and defect of the polycide gate sidewall. The undercut part 23 of the polysilicon layer 13 and the consumed part 25 of the metal silicide layer 15 are shown.

The polycide gate structure consists of the films of metal silicide and polysilicon, and the layer located thereunder is composed of the thin oxide film. Accordingly, through a single etching process under constant conditions, it is very difficult to form a gate at a proper etching speed, sufficient etching selectivity for the etching mask and a plurality of material layers located thereunder, and a sidewall which has few defects and maintains good vertical morphology.

As another conventional method for solving such problems, there was used a method in which the etching is performed under the process condition beyond the above described two kinds, in which the conditions such as the plasma source gas for carrying out the etching process, the power of the equipment applying the plasma, and the pressure and temperature of the process chamber are changed. However, in case of performing the process with two kinds of steps or more, even if the process conditions of each step are changed minutely, the result of the process shows a very large difference. The aforementioned defect of the gate sidewall or the poor vertical profile shows a difference in one semiconductor substrate as well as between substrates. It was very difficult to maintain the stability of the process.

SUMMARY OF THE INVENTION

In order to solve the aforementioned problems, it is an object of the present invention to provide a method of forming a polycide gate, wherein the etching speed and etching selectivity are sufficient, the vertical profile of the etched gate sidewall is good, defects in each film are few, and the stability of the process itself is maintained.

To accomplish the object of the present invention, in a method of forming a polycide gate of a semiconductor device wherein the gate is formed by etching a structure where a polysilicon layer and a metal silicide layer are stacked on a semiconductor substrate, there is provided an etching method comprising the steps of etching all the metal silicide layer by using a plasma, and etching the polysilicon layer by relatively decreasing the power which plays a role of increasing the energy of particles constituting the plasma, as compared with that in the step of etching the metal silicide layer.

It be preferable that the present invention is carried out under a plasma environment of low pressure and high concentration. Here, the low pressure and high concentration plasma environment make the mean free path of particles long, by maintaining low the pressure of the plasma source gas performing the etching. In the plasma environment, the real density of the plasma is maintained high increasing the probability that particles constitute the conductor substrate, according to the method of applying the magnetic field. Such a low pressure and high concentration plasma environment is made possible through equipment such as transfer coupling plasma (TCP) developed as a new plasma source, electron cyclotron resonance (ECR), and the like. The low pressure is a pressure of 30m Torr and less, and more preferably, 10m Torr and, less.

In general, the source gas is supplied to the process chamber in which the etching process is performed, and formed into a plasma through the plasma applying device. Then, particles of the plasma react with the exposed surface of the semiconductor substrate in the chamber, thereby performing plasma etching or RIE. In the early days of plasma etching, there was used a method in which a material to be etched was made to move under the plasma environment applied through a device applying only plasma. However, it has been developed into an object that the energy level of the plasma should be increased simultaneously with applying the plasma by the same device or a separate device, thereby increasing the reactivity. In the present invention, the voltage or power of such device is changed to thereby vary the energy related to the etching reaction, such as the kinetic energy of the plasma particles. The power is mainly supplied from an electric energy source such as a radio frequency (RF) power source via the upper, or "TCP" electrode and the lower, or "BOT" electrode of a transfer coupling plasma, or "TCP" equipment. However, a method in which the power is supplied from a non-electric energy source such as a direct heating, is not excluded.

The kind of gas used as the plasma source gas becomes an important variable in the plasma etching process. As gases used hitherto, there are HBr, $O_2$, $Cl_2$, $HeO_2$, $SF_6$, etc., and mixtures thereof. More particularly, a gas or gas mixture where the overall process speed and selectivity are good while the polycide gate forms the stacked structure having the good vertical profile must be selected.

Further, since the polycide gate is etched through two-step etching process, the process efficiency can be increased if the same kind of gas can be used during the both of the steps. In case of using a gas mixture, even if a different mixture ratio is used by steps, a gas mixture consisting of the same kind of gas is preferably used, because the required process time with the step variation can be shortened.

In general, fluorine-group and chlorine-group gases are mainly used in the process of etching the polysilicon. The chlorine-group gases such as Cl or $CCl_4$ show an anisotropic etching pattern which is formed thinly, so that the selectivity to the gate oxide film constituting the underlayer is high. However, there is a demerit that a great deal of polymer is generated. In case that the process of etching the polycide gate is performed by using the oxide film as an etching mask, the etching process using the chlorine-group gas is proper because the problem caused by the polymer is substantially diminished. According to an experiment, as compared with the case of using pure chlorine, the case of using a gas mixture where the component ratio of chlorine is high such that the mixture ratio of chlorine and oxygen is about 4~25, has good etching characteristics, such as the stability of the process, the high selectivity, increase in vertical property of the sidewall formed, and decrease in the front of the defective portion, in the two-step etching process of the present invention.

A method for forming a polycide gate of a semiconductor device to carry out the above objectives include a step of providing a semiconductor substrate having applied thereon, in spatial succession, an oxide film layer, a polysilicon layer, a metal silicide layer and a patterned etching mask layer covering less than all of the metal silicide layer, so that a respective uncovered portion of the metal silicide layer is available for etching from an outer surface thereof. One interface exists where the metal silicide layer adjoins the polysilicon layer, and another interface exists where the polysilicon layer adjoins the oxide film layer.

The above method further includes a step of applying a plasma by transfer plasma coupling equipment at a transfer coupling plasma power level in the range of from 250 to about 350 watts inwards through a gap of 5.9 cm towards the substrate, where the metal silicide layer is not covered by the etching mask layer while subjecting particles in the plasma to BOT power at a first power level in the range of from 200 to about 300 watts, for increasing the energy with which the plasma particles collide with each other to a first energy level. This step causes etching away the layer material, including all of the metal silicide layer where the layer material is not covered by the etching mask layer, inwards to a level which is at least as close to the substrate as the one interface, leaving in place on the dioxide film layer a remainder of the polysilicon layer not covered by the etching mask layer. In the alternative, the level can be closer to the substrate than is the one interface, so that an outer portion of the polysilicon layer is etched away.

The above method also includes a step of applying a plasma by the transfer plasma coupling equipment at a transfer coupling plasma power level in the range of from 250 to about 350 watts inwards through a gap of 5.9 cm towards said substrate while subjecting particles in the plasma to BOT power at a second power level in the range of from 70 to about 130 watts, for increasing the energy with which the plasma particles collide with each other to a second level which is lower than said second energy level, where the remainder of the polysilicon layer is not covered by the etching mask layer. This step causes etching away the remainder of the polysilicon layer where the layer is not covered by the etching mask layer.

DETAILED DESCRIPTION OF A PREFERRED EMBODIMENT OF THE INVENTION

Hereinafter, one embodiment of the present invention will be described with reference to FIG. 3.

The present embodiment is carried out by using transfer coupling plasma (TCP) equipment which, as described hereinabove one of the presently available type of high density plasma source equipment. The method comprises seven steps, including the steps of etching all the metal silicide layer and a part of a polysilicon layer, and etching the remaining polycide by relatively decreasing the power, which serves the function of increasing the energy of particles constituting the plasma. The specific process condition is shown in the following <Table 1>.

TABLE 1 etching process of polycide gate, using TCP equipment

| step | pressure (mTorr) | TCP power (W) | BOT power (W) | GAP (Cm) | Cl$_2$ (sccm) | O$_2$ (sccm) | B/S He (Torr) | classification |
|---|---|---|---|---|---|---|---|---|
| 1 | 3~10 |  |  | 5.9 |  |  |  | TIME 10" |
| 2 | 3~10 |  |  | 5.9 | 30~50 | 2~8 | 7~12 | STABL 20" |
| 3 | 3~10 | 250~350 | 200~300 | 5.9 | 30~50 | 2~8 | 7~12 | EDP 20~60" |
| 4 | 3~10 | 250~350 | 200~300 | 5 9 | 30~50 | 2~8 | 7~12 | OE 10~60% |
| 5 | 3~10 |  |  | 5.9 | 30~50 | 2~8 | 7~12 | STABI 20" |
| 6 | 3~10 | 250~350 | 70~130 | 5.9 | 30~50 | 2~8 | 7~12 | TIME 15~50" |
| 7 | 3~10 |  |  | 5.9 |  |  |  | TIME 10" |

The first step is one in which a voltage is applied to the chuck of the equipment whereon a semiconductor substrate is located, thereby fixing the substrate. In order to cause to be uniform the temperature of the substrate in a subsequent step, it is necessary to fix the substrate, because helium gas (B/S He) is flowed in a back part of the substrate.

The second step is a preparation step of controlling the pressure and the flow quantity of the gas, before plasma is applied to the process chamber.

The third step is one in which the plasma is formed to thereby perform etching. It corresponds to the step of etching a metal silicide layer, in the present invention. Using an oxide film having a pattern formed on the top of the substrate as an etching mask, the metal silicide, excluding a part constituting a gate, is removed. In this third step, etching is carried out to the second support line 37 of FIG. 3. After end point detection (EDP) is carried out through the sensor of the equipment at the point of time the polysilicon is exposed first, the following step is performed.

The fourth step is carried out continuously under the same process conditions as that of the third step. It is an over-etching (OE) step, in which etching a part of the polysilicon film is carried out from second support line 37 to a third support line 39 of FIG. 3. This is because the metal silicide remains on a sufficient part of the substrate at the point of time the EPD is carried out. In this fourth step, 10% to 60% of the polysilicon is etched. This value takes into account the increase in the overall process speed and the possibility of damaging the gate oxide film.

Figure 1:
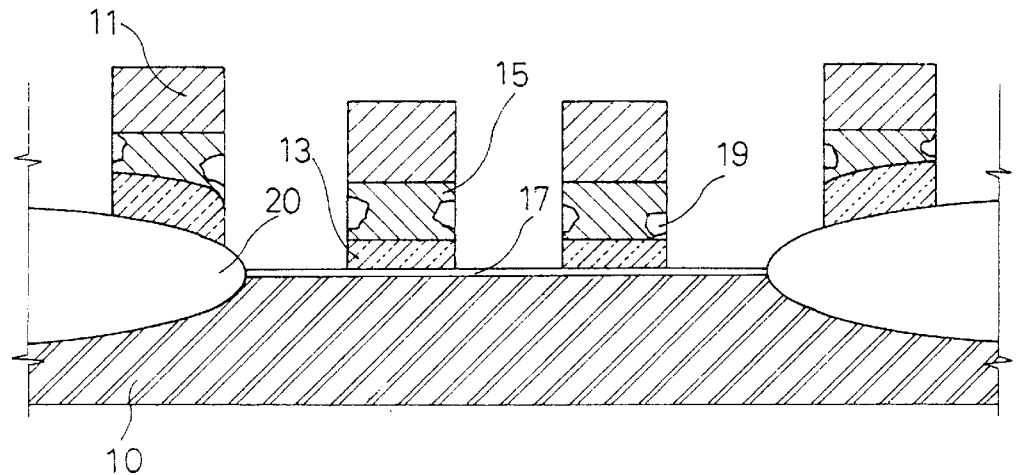
FIG. 1 is a cross-sectional view of a polycide gate formed by a conventional method.
Figure 2:
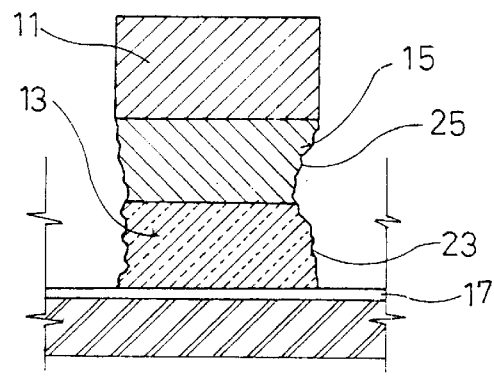
FIG. 2 is a cross-sectional view on a larger scale than FIG. 1, shows defects in the polycide gate formed through the conventional method.
Figure 3:
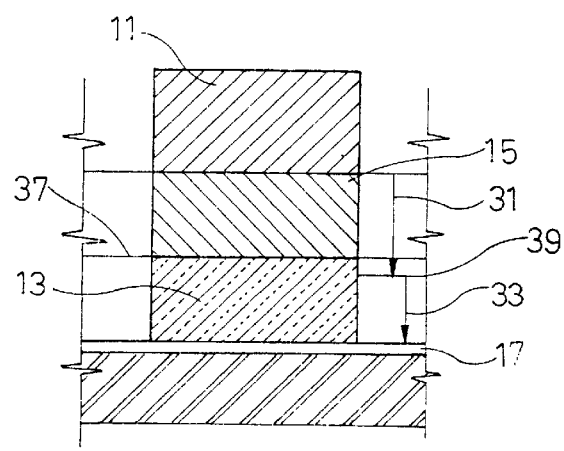
FIG. 3 is a cross-sectional view showing a polycide gate formed according to one embodiment of the present invention.

Reference numeral 31 in FIG. 3 corresponds to an arrow showing the thickness of the polycide film etched in the step of etching all the metal silicide and a part of the polysilicon, i.e., in the third and fourth steps. In the third and fourth steps, the speed of the etching process and whether the etching pattern is anisotropic or not are important. Since a sufficient amount of the material is left to be removed by etching, the problem that the thin gate oxide film located thereunder is damaged need not be considered. Further, since the oxide film located in the top layer of the gate portion constituting the etching mask is relatively thick and hard, etching selectivity is less important in this step. Accordingly, in this step, it is necessary to apply a high voltage and to select a gas in order to increase the reactivity with respect to etching by the plasma particles. In the present invention, the TCP power in <Table 1> serves a function forming a magnetic field so as to apply the plasma and to increase the density. The BOT power serves a function of increasing the energy with which the plasma particles collide with each other.

The fifth step is one in which the condition of etching is controlled and stabilized before the remaining polysilicon film, excluding the gate part, is etched. At this time, the power is not supplied to the plasma applying device nor to the device for increasing the energy level of the particles so that etching is not carried out.

The sixth step is one in which the polysilicon located under the metal silicide layer is etched. It corresponds the step of etching the remaining polysilicon by relatively decreasing the power, which serves a function of increasing the energy of the particles constituting the plasma. Reference numeral 33 in FIG. 3 corresponds to an arrow showing the thickness of the polycide film removed as a result of conducting the sixth step, i.e., the polysilicon. Since the material to be etched, i.e., the polysilicon is but little left, the high selectivity to a thin gate oxide film located under the polysilicon is required, rather than a speed for the etching process. A gas having a high selectivity or, a gas mixture having such high selectively must be used, decreasing the power of the etching device affecting the energy of the plasma particles. In <Table 1>, there is indicated as being applied a BOT power of 70 W to 130 W, which is a half and less than that of the 200 W to 300 W used in the third and fourth steps. As the BOT power is decreased, the selectivity of the polysilicon with respect to the oxide film can be rapidly increased to 50:1 or more by adjusting the component ratio of the chlorine and oxygen.

The seventh step is to remove the polymer generated as a by-product in the etching process, and is the last step of the present invention.

In the present invention, a physically and functionally stable polycide gate in which the vertical profile of the gate sidewall is good and the extent of defects is decreased can be simply and rapidly formed, as compared with the conventional multi-step etching process.

The present invention is not confined to the aforementioned embodiment and can be modified into various forms by one of ordinary skill in the art, within the spirit and scope of the present invention, as defined in the appended claims.

What is claimed is:

1. A method for forming a polycide gate of a semiconductor device, comprising the steps of:

(a) providing a semiconductor substrate having applied thereon in spatial succession, an oxide film layer, a polysilicon layer, a metal silicide layer and a patterned etching mask layer covering less than all of said metal silicide layer, so that a respective uncovered portion of the metal silicide layer is available for etching from an outer surface thereof, one interface exists where said metal silicide layer adjoins the polysilicon layer, and another interface exists where said polysilicon layer adjoins the oxide film layer;

(b) applying a plasma by transfer plasma coupling equipment at a transfer coupling plasma power level in the range of from 250 to about 350 watts inwards through a gap of 5.9 cm towards said substrate, where the metal silicide layer is not covered by said etching mask layer while subjecting particles in the plasma to bottom electrode power at a first power level in the range of from 200 to about 300 watts, for increasing the energy with which the plasma particles collide with each other to a first energy level, for thereby etching away layer material, including all of the metal silicide layer where not covered by said etching mask layer, inwards to a level which is at least as close to said substrate as said one interface, leaving in place on said oxide film layer a remainder of said polysilicon layer not covered by said etching mask layer; and (c) applying a plasma by said transfer plasma coupling equipment at a transfer coupling plasma power level in the range of from 250 to about 350 watts inwards through a gap of 5.9 cm towards said substrate while subjecting particles in the plasma to bottom electrode power at a second power level in the range of from 70 to about 130 watts, for increasing the energy with which the plasma particles collide with each other to a second level which is lower than said first energy level, where said remainder of said polysilicon layer is not covered by said etching mask layer, and thereby etching away said remainder of said polysilicon layer where not covered by said etching mask layer.

2. The method of claim 1, wherein:

said etching of steps (b) and (c) is carried out in a low pressure environment of less than 30m Torr, using a high density plasma.

3. The method of claim 1, wherein:

said etching mask layer is a silicon oxide film.

4. The method of claim 3, wherein:

in practicing steps (b) and (c), said plasma is generated from a source gas which is a mixture of chlorine and oxygen.

5. The method of claim 1, wherein:

the metal silicide of said metal silicide layer is tungsten silicide.

6. The method of claim 1, wherein:

said level is closer to said substrate than is said one interface, so that an outer portion of said polysilicon layer is etched away in step (b).

7. The method of claim 6, wherein:

said outer portion of said polysilicon layer constitutes an outer 10% to 60% of said polysilicon layer as provided in step (a).

8. The method of claim 1, further comprising:

between conducting steps (b) and (c), conducting a stabilizing step for varying etching conditions from those of step (b) to those of step (c).

9. The method of claim 1, wherein:

steps (a) and (b) are practiced under etching conditions which differ only as to said power and particle energy levels.

* * * * *